US005278419A

United States Patent [19]

Takahashi et al.

[11] Patent Number: 5,278,419

[45] Date of Patent: Jan. 11, 1994

[54] ELECTRON BEAM EXPOSURE PROCESS FOR WRITING A PATTERN ON AN OBJECT BY AN ELECTRON BEAM WITH A COMPENSATION OF THE PROXIMITY EFFECT

[75] Inventors: Yasushi Takahashi; Hiroshi Yasuda, both of Kawasaki, Japan

[73] Assignee: Fujitsu Limited, Kawasaki, Japan

[21] Appl. No.: 925,110

[22] Filed: Aug. 6, 1992

[30] Foreign Application Priority Data

Aug. 8, 1991 [JP] Japan .................................. 3-199510

[51] Int. Cl.[5] ........................................... H01J 37/302

[52] U.S. Cl. .................................. 250/492.2; 250/398

[58] Field of Search ................ 250/492.2, 492.22, 398; 430/296

[56] References Cited

U.S. PATENT DOCUMENTS

| | | | |
|---|---|---|---|
| 4,500,789 | 2/1985 | Ban et al. | 250/492.2 |
| 4,520,269 | 5/1985 | Tone | 250/492.22 |
| 4,998,020 | 3/1991 | Misaka et al. | 250/492.2 |
| 5,051,598 | 9/1991 | Ashton et al. | 250/492.22 |

FOREIGN PATENT DOCUMENTS

| | | |
|---|---|---|
| 0166549 | 1/1986 | European Pat. Off. . |
| 0366367 | 5/1990 | European Pat. Off. . |
| 2755399 | 6/1978 | Fed. Rep. of Germany . |
| 3939456 | 6/1991 | Fed. Rep. of Germany . |

OTHER PUBLICATIONS

Patent Abstracts of Japan, vol. 15, No. 250 (E-1082) 26 Jun. 1991 & JP-A-03 080 525 (Matsushita Electric Ind Co. Ltd) 5 Apr. 1991 * abstract *.

*Primary Examiner*—Paul M. Dzierzynski
*Assistant Examiner*—Kiet T. Nguyen
*Attorney, Agent, or Firm*—Staas & Halsey

[57] ABSTRACT

A method for writing a pattern on an object by a charged particle beam comprises the steps of: dividing a pattern to be written on the object into a plurality of pattern blocks that cause a proximity effect with each other; determining a pattern density for each of said pattern blocks; selecting a specific pattern block as a reference pattern block; setting a dose level of exposure of the charged particle beam to a reference dose level such that the reference pattern block is exposed with a predetermined total dose level which includes the contribution of the exposure by the charged particle beam and the contribution of the exposure by the backscattered charged particles; exposing the plurality of pattern blocks including the reference pattern block by the charged particle beam with the reference dose level; and exposing those pattern blocks that have the pattern density smaller than the pattern density of the reference pattern block by a defocused charged particle beam with a total dose level set such that the total dose level for those pattern blocks is substantially identical with the total dose level of the reference pattern block.

12 Claims, 14 Drawing Sheets

| | | | IA | | | |
|---|---|---|---|---|---|---|
| O | O | O | O | O | O | O |
| O | 40 | 40 | 40 | 40 | 40 | O |
| O | 40 | 40 | 40 | 40 | 40 | O |
| O | 40 | 40 | 40 | 40 | 40 | O |
| O | O | O | O | O | O | O |
| O | O | O | O | O | O | O |
| 40 | 40 | O | O | O | 40 | 40 |

1

1

ELECTRON BEAM EXPOSURE PROCESS FOR WRITING A PATTERN ON AN OBJECT BY AN ELECTRON BEAM WITH A COMPENSATION OF THE PROXIMITY EFFECT

BACKGROUND OF THE INVENTION

The present invention generally relates to fabrication of semiconductor devices and more particularly to a process for writing a semiconductor pattern on an object such as a semiconductor substrate with a compensation for the proximity effect.

The electron beam lithography is a key process for fabricating advanced semiconductor integrated circuits having a very large integration density. With the use of the electron beam lithography, a device pattern having a line width of less than 0.05 μm can be fabricated easily with an alignment error of less than 0.02 μm. Thus, the electron beam lithography is expected to play a major role in the fabrication of future integrated circuits such as DRAMs having a storage capacity of 256 Mbits or more.

In the fabrication of memory devices, the throughput of production is an essential factor, in addition to the resolution of the device patterning. In this respect, the electron beam lithography that uses a single, focused electron beam for the exposure, is disadvantageous as compared with the conventional optical exposure process that exposes the entire device pattern in one single shot. On the other hand, such a conventional optical exposure process is reaching its limit of resolution, and there is a situation that one has to rely upon the electron beam exposure process for the fabrication of the large capacity memory devices of the future.

Under such circumstances, various efforts have been made for improving the throughput of the electron beam exposure process For example, the inventor of the present invention has previously proposed a so-called block exposure process wherein the device pattern is decomposed into a number of fundamental patterns and the electron beam is shaped in accordance with one of these fundamental patterns. With the use of the block exposure process, one can now achieve a throughput of about 1 $cm^2$/sec.

FIG. 1 shows the construction of a conventional electron beam exposure system that uses the technique of block exposure. Referring to the drawing, the electron beam exposure system is generally formed from an electron optical system 100 for producing and focusing an electron beam and a control system 200 for controlling the optical system 100.

The electron optical system 100 includes an electron gun 104 as a source of the electron beam. The electron gun 104 includes a cathode electrode 101, a grid electrode 102 and an anode electrode 103, and produces the electron beam generally in the direction of a predetermined optical axis O in the form of spreading beam.

The electron beam thus produced by the electron gun 104 is passed through a shaping aperture 105*a* formed in an aperture plate 105. The aperture plate 105 is provided such that the aperture 105*a* is in alignment with the optical axis O and shapes the incident electron beam to have a rectangular cross section.

The electron beam thus shaped is received by an electron lens 107*a* that has a focal point coincident to the aperture 105*a*. Thereby, the incident electron beam is converted to a parallel beam and enters into an electron lens 107*b* that focuses the electron beam on a block mask 110. It should be noted that the lens 107*b* projects the image of the rectangular aperture 105*a* on the block mask 110. As shown in FIG. 2, the block mask 110 carries a number of fundamental patterns 1*a*, 1*b*, 1*c*, . . . of the semiconductor device pattern to be written on the substrate in the form of apertures, and shapes the electron beam according to the shape of the aperture through which the electron beam has passed.

In order to deflect the electron beam passed through the electron lens 107*b* and address the desired aperture, deflectors 111, 112, 113 and 114 are provided, wherein the deflector 111 deflects the electron beam away from the optical axis O in response to a control signal SM1. The deflector 112 in turn deflects back the electron beam generally in parallel to the optical axis O in response to a control signal SM2. After passing through the block mask 110, the deflector 113 deflects the electron beam toward the optical axis O in response to a control signal SM3, and the deflector 114 deflects the electron beam such that the electron beam travels coincident to the optical axis O in response to a control signal SM4. Further, the block mask 110 itself is provided movable in the direction perpendicular to the optical axis O for enabling the addressing of the apertures on the entire surface of the block mask 110 by the electron beam.

The electron beam thus passed through the block mask 110 is then focused at a point f1 that is located on the optical axis O after passing through electron lenses 108 and 116. There, the image of the addressed aperture on the block mask 110 is demagnified at the point f1. The electron beam thus focused is then passed through a blanking aperture 117*a* formed in a blanking plate 117 and further focused on the surface of a substrate 123 that is held on a movable stage 126, after passing through electron lenses 119 and 120 that form another demagnifying optical system. There, the electron lens 120 serves for an objective lens and includes various coils such as correction coils 120 and 121 for focusing compensation and astigmatic compensation as well as deflection coils 124 and 125 for moving the focused electron beam over the surface of the substrate 123.

In order to control the exposure operation, the electron beam exposure system of FIG. 1 includes the control system 200, wherein the control system 200 includes memory devices such as a magnetic tape device 201 and magnetic disk devices 202, 203 that are provided to store various data of the device pattern of the semiconductor device to be written. In the illustrated example, the magnetic tape device 201 is used for storing various design parameters, the magnetic disk device 202 is used for storing the exposure pattern data, and the magnetic disk device 203 is used for storing the pattern of the apertures on the block mask 110.

The data stored in the memory devices is read out by a CPU 204 and transferred to an interface device 205 after data decompression. There, the data for specifying the pattern on the block mask 110 is extracted and stored in a data memory 206. The data stored in the data memory 206 is then transferred to a first control unit 207 that produces the foregoing control signals SM1–SM4 and supplies the same to the deflectors 111–114. Further, the control unit 207 produces and supplies a control signal to a mask moving mechanism 209 that moves the block mask 110 in the direction transverse to the optical path O. In response to the deflection of the optical beam by the deflectors 111–114 and further in response to the lateral movement of the block mask 110, one can address the desired aperture on the mask 110 by the electron beam.

The first control unit 207 further supplies a control signal to a blanking control unit 210 that in turn produces a blanking signal for shutting off the electron beam. This blanking signal is then converted to an analog signal SB in a D/A converter 211 and the analog signal SB is supplied to a deflector 115 that causes a deflection of the electron beam away from the optical axis O. In response to this, the electron beam misses the blanking aperture 117*a* and disappears from the surface of the substrate 123. Further, the control unit 207 produces a pattern correction data $H_{ADJ}$ and supplies the same to a D/A converter 208. The D/A converter 208 in turn produces a control signal $S_{ADJ}$ and supplies the same to a deflector 106 that is provided between the electron lens 107*a* and the electron lens 107*b*. Thereby, one can modify the shape of the electron beam that have passed through the addressed aperture in the mask 110. This function is used when the desired shape of the electron beam is different from the shape given by the apertures on the block mask 110.

The interface device 205 further extracts and supplies the data for controlling the movement of the electron beam on the surface of the substrate 123 to a second control unit 212. In response thereto, the control unit 212 produces a control signal for controlling the deflection of the electron beam on the surface of the substrate 123 and supplies the same to a wafer deflection control unit 215 that in turn produces and supplies deflection control signals to D/A converters 216 and 217. The D/A converters 216 and 217 in turn produce drive signals SW1 and SW2 for driving the deflectors respectively and supply the same to the deflectors 124 and 125 for causing the deflection of the electron beam. Thereby, the position of the stage 126 is detected by a laser interferometer 214 and the wafer deflection control unit 215 modifies the output deflection control signals and hence the drive signals SW1 and SW2 according to the result of measurement of the stage position by the laser interferometer. Further, the second control unit 212 produces a control signal that causes a lateral movement of the stage 126.

FIGS. 3(A) and 3(B) show the exposure of various patterns on the substrate 123 achieved by the apparatus of FIG. 1.

Referring to FIG. 3(A), the drawing shows the energy or dose of the electron beam supplied to an electron beam resist that covers the surface of the substrate for a case where the exposed device pattern designated as $P_1$ has a pattern density $\alpha$ close to 100%. The pattern density herein means the percentage of the region of the substrate that is exposed by the electron beam. In FIG. 3(A), the threshold of exposure energy is represented as TH. When the dose of the electron beam exceeds the foregoing threshold TH, the exposure of the electron beam resist occurs. On the other hand, when the dose does not reach the threshold TH, no exposure is made.

In the exposure of FIG. 3(A), it should be noted that there is a substantial background exposure as represented by $\beta$, which is caused by the backscattering of electrons from the substrate. Such a background exposure is known as "proximity effect." When such a background exposure occurs, the dose of the electron beam for the device pattern $P_1$ increases inevitably as indicated in FIG. 1(A). As a natural consequence, such a background exposure does not occur in small isolated patterns such as a pattern $P_2$ where the backscattering of the electrons is small. Thereby, there occurs a difference in the dose of exposure between the region where a dense pattern is exposed and the region where a small isolated pattern is formed.

A similar change of dose occurs also between the device patterns having a large pattern density such as the pattern $P_1$ and the device patterns having less dense pattern density such as a pattern $P_3$ shown in FIG. 3(B). The device pattern $P_3$ of FIG. 3(B) has a pattern density of 50%, for example, and there occurs a backscattering of the electrons with a magnitude represented as $\alpha\beta$.

Under such a situation, it will be understood that the variation of exposure, caused by the backscattering of electrons, has to be compensated for such that there is a uniform background exposure. Otherwise, there occurs a case where small isolated patterns such as the pattern $P_2$ of FIG. 3(A) are not exposed.

In order to achieve the desired compensation for the background exposure, a so-called ghost exposure process is proposed by Owen et al. (Owen, G., Rissman, P. and Long, M. F., Application of the Ghost proximity effect correction scheme to round beam and shaped beam electron lithography systems, J. Va. Sci. Technol. B3(1), January/February 1985), which is incorporated herein as reference.

FIGS. 4(A)–4(C) show the principle of the foregoing ghost exposure process, wherein FIG. 4(A) shows the exposure corresponding to FIGS. 3(A) and 3(B) where there is no compensation of the proximity effect. There, it will be noted that the dose or level of exposure changes in the patterns $P_1$, $P_2$ and $P_3$ because of the different level of backscattering and hence the background exposure. Further, it should be noted that there occurs a change in the level of dose even in the same device pattern between the region located at the center of the pattern and the region located at the margin of the pattern. In other words, there appears a shoulder at the marginal part of the exposed device pattern.

In order to compensate for the non-uniform background exposure, the ghost exposure process uses a diffused or defocused electron beam that is produced in correspondence to the inversion of the exposed device patterns as shown in FIG. 4(B). By superposing the ghost exposure of FIG. 4(B) on the exposure of the real pattern of FIG. 4(A), one can obtain a uniform background level throughout the patterns $P_1$, $P_2$ and $P_3$ as shown in FIG. 4(C). Thereby, the problem of undesirable variation of the dose is successfully eliminated.

In the exposure process of FIG. 4(C), however, there exists an obvious disadvantage in that the ghost exposure has to be conducted for the entire surface of the substrate, regardless of the fact that there is a device pattern or not. Thereby, the efficiency of exposure is substantially reduced.

In the exposure process of FIG. 4(C), there exists another, more serious problem in that the fine device patterns such as the pattern $P_3$ tend to be exposed excessively because of the increased background level. More specifically, the ghost exposure of FIG. 4(B) inevitably sets the background level of exposure of the device pattern $P_3$ substantially identical with the background level of the device pattern $P_1$ that fills or occupies an area of the substrate continuously with the pattern density $\alpha$ of about 100%. In FIG. 4, it should be noted that the threshold dose of the electron beam resist is represented by the broken line designated as TH. When the fine device pattern such as the pattern $P_3$ is subjected to the excessive exposure, there arises a problem in that the size of the individual spot or line that forms the pattern $P_3$ tends to be enlarged. Thereby, the proper exposure of fine or minute device patterns, which are essential for the fabrication of large storage memory devices, is no longer possible.

FIG. 5 shows the foregoing problem of increase of size of the exposed device pattern caused by the excessive dose of the exposure. For the sake of illustration, FIG. 5 is exaggerated significantly.

Referring to FIG. 5, the size of the exposed pattern such as a dot or line changes in relation to the dose of exposure and the threshold level of the electron beam resist. In the case where the level of dose is close to the threshold of exposure as represented by $TH_1$, one obtains a pattern size $D_2$ that is close to the desired device pattern $D_1$. On the other hand, when the level of dose exceeds the threshold of exposure substantially as represented by $TH_2$, one obtains a much larger pattern size $D_3$. Thus, the exposure of the device patterns such as the pattern $P_3$ by the ghost exposure inevitably decreases the resolution of the exposed pattern. In the worst case, the desired device pattern cannot be exposed.

One may think that such a problem of ghost exposure would be avoided by simply increasing the dose for those parts of the device pattern wherein the dose is insufficient such as the marginal part of the device. FIGS. 6(A)–6(D) show an example of the compensation for the insufficient dose according to the above mentioned principle, wherein FIG. 6(A) shows the device pattern to be exposed and FIG. 6(B) shows the corresponding background exposure level caused by the proximity effect. As a result of the reduced backscattering of electrons at the marginal part, the device pattern of FIG. 6(A) takes a form shown in FIG. 6(C) wherein the size of the individual pattern elements forming the device pattern of FIG. 6(A) is reduced at the marginal part. More specifically, it will be noted that the elongated rectangular pattern element forming the device pattern of FIG. 6(A) is deformed into a trapezoidal shape because of the reduced dose at the outer edge part of the device pattern. Thus, even when the dose of the exposure is increased in correspondence to the marginal part for compensating for the reduced dose in these parts, the trapezoidal shape of the Pattern element is not rectified. See FIG. 6(D) that shows the device pattern exposed on the substrate with such a compensation process. In order to obtain a correct rectangular shape of the exposed pattern element, one has to divide the pattern element into a plurality of subelements and change the dose in correspondence to each subelement as shown in FIG. 6(D) by the asterisk, solid circle and the solid square However, such a subdivision of the pattern element is contradictory to the improvement of throughput of exposure achieved by the block exposure process.

SUMMARY OF THE INVENTION

Accordingly, it is a general object of the present invention to provide a novel and useful electron beam exposure process wherein the foregoing problems are eliminated.

Another and more specific object of the present invention is to provide an electron beam exposure process wherein the proximity effect is successfully eliminated without sacrificing the resolution or accuracy of the exposed device pattern.

Another object of the present invention is to provide a process for writing a pattern on an object by a finely focused charged particle beam, comprising the steps of: dividing a pattern to be written on said object into a plurality of pattern blocks separated from each other with a distance that is small enough such that a proximity effect is caused with each other; determining a pattern density that represents a proportion of an exposed area in the pattern block, for each of said pattern blocks; selecting a specific pattern block as a reference pattern block and setting a dose level of the charged particle beam for said reference pattern block to a reference dose level determined such that said reference pattern block is exposed with a predetermined, first total dose level, said first total dose level being defined as a sum of said reference dose level and a backscattering dose level caused by a backscattering of charged particles from said object; exposing said plurality of pattern blocks including said reference pattern block by the charged particle beam with said reference dose level; and exposing those pattern blocks that have the pattern density smaller than the pattern density of said reference pattern block by a defocused charged particle beam with a second total dose level, defined as a sum of said reference dose level, a backscattering dose level caused by a backscattering of charged particles from said object, and a dose level of said defocused electron beam, such that said second total dose level becomes substantially identical with said first total dose level. According to the present invention, it is possible to compensate for the proximity effect that tends to decrease the dose of the pattern blocks having a small pattern density, without sacrificing the resolution of the specific pattern block that may have the smallest exposure pattern therein. Thereby, a successful exposure is achieved while maximizing the resolution of exposure for those parts that are essential for the operation of the semiconductor device.

Another object of the present invention is to provide a process for writing a pattern on an object by a focused charged particle beam, comprising the steps of: exposing a predetermined exposure pattern defined with respect to a non-exposure region by a boundary, by means of a charged particle beam with a substantially uniform dose, such that said exposure pattern is exposed at a central part thereof with a first total dose level, said first total dose level being defined as a sum of said uniform dose and a dose caused by backscattered charged particles; and irradiating a defocused electron beam selectively along said boundary of said predetermined exposure pattern such that a second total dose level, defined as a sum of a dose caused by said defocused beam, a dose caused by backscattered charged particles, and said uniform dose, becomes substantially identical with said first total dose level. According to the present invention, the ghost exposure is achieved selectively to the boundary part of the exposed pattern and the unnecessary exposure to the part where no exposure pattern exists is avoided. Thereby, the efficiency of exposure is significantly improved over the conventional ghost exposure process.

Another object of the present invention is to provide a process for writing a pattern on an object by a focused charged particle beam, comprising the steps of: dividing the pattern to be exposed into a plurality of pattern blocks separated from each other with a sufficient distance such that no proximity effect occurs between adjacent pattern blocks; determining a pattern density that represents a proportion of an exposed area in the pattern block, for each of said pattern blocks; selecting a specific pattern block that has the largest pattern density as a reference pattern block; setting a dose level of the charged particle beam with respect to said reference pattern block such that said reference pattern block is exposed with a predetermined total dose level that is defined as a sum of said dose level of said charged particle beam and a backscattering dose level caused by a backscattering of charged particles from said object; setting a dose level of the charged particle beam with respect to each of said pattern blocks excluding said reference pattern block such that each of said pattern blocks is exposed with a dose level that is determined as a function of the pattern density such that a sum of said dose level of said charged particle beam and a backscattering dose level caused by a backscattering of charged particles from said object becomes substantially identical with said predetermined total dose level; and exposing said plurality of pattern blocks including said reference pattern block by the charged particle beam with respective dose levels determined with respect to said plurality of pattern blocks. According to the present invention, an optimization of the dose level is achieved for each of the pattern blocks depending on the pattern density without causing excessive exposure that deteriorates the resolution of patterns written on the object.

Other objects and further features of the present invention will become apparent from the following detailed description when read in conjunction with the attached drawings.

DETAILED DESCRIPTION OF THE PREFERRED EMBODIMENTS

Figure 7A:
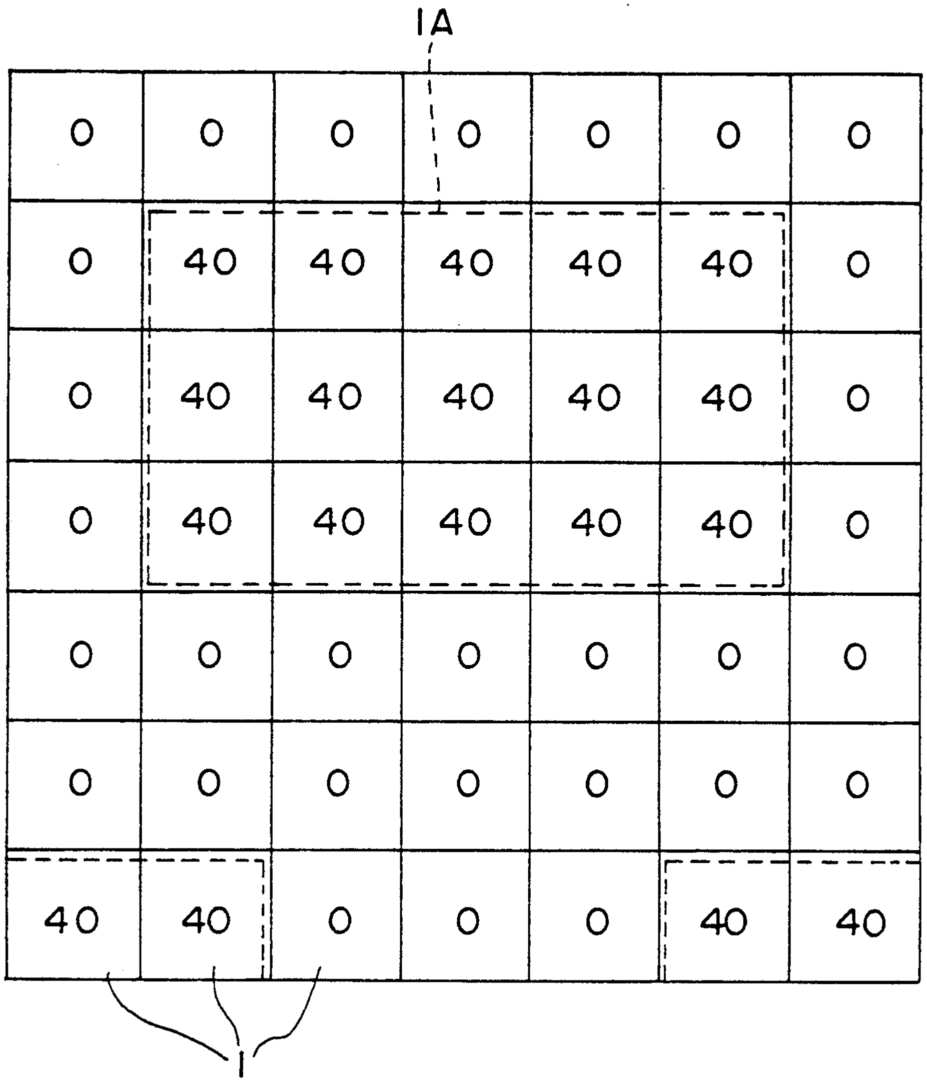
FIG. 7(A) is a diagram showing a device pattern that is subjected to a first embodiment process of the present invention.

FIG. 7(A) shows an example of the device pattern of a memory device that is formed on a substrate as a result of the electron beam exposure. In the pattern of memory devices, there is a tendency that the same device pattern is repeated a number of times over the substrate.

Figure 2:
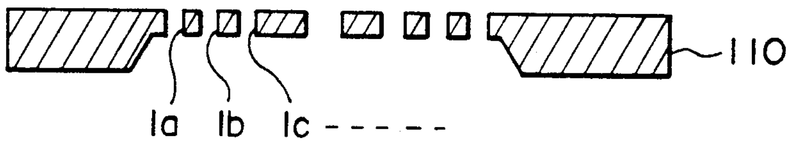
FIG. 2 is a diagram showing an example of a block mask used in the conventional system of FIG. 1.
Figure 3A:
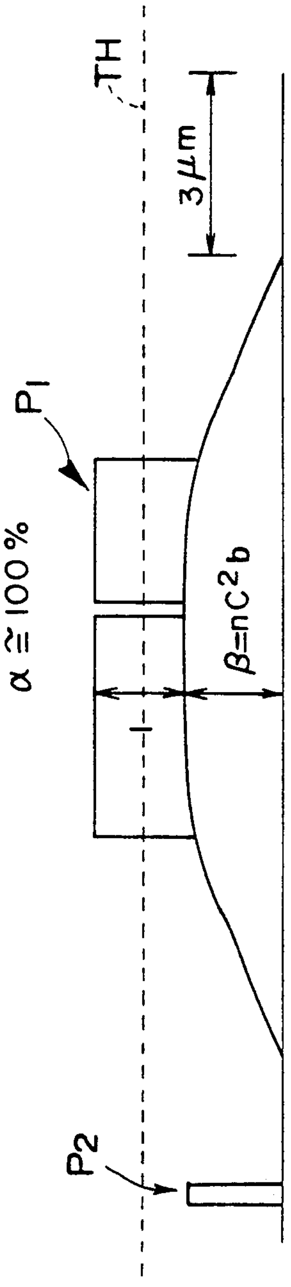
FIGS. 3(A) and 3(B) are diagrams showing the proximity effect that occurs when a fine device pattern is exposed by the electron beam exposure system of FIG. 1.
Figure 3B:
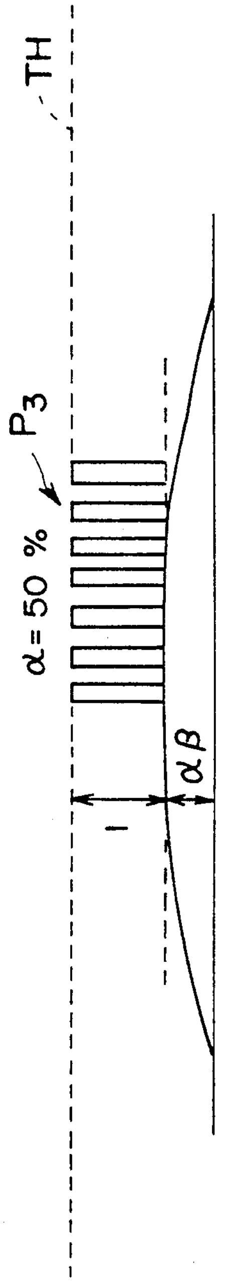
Figures 4A, 4B, 4C:
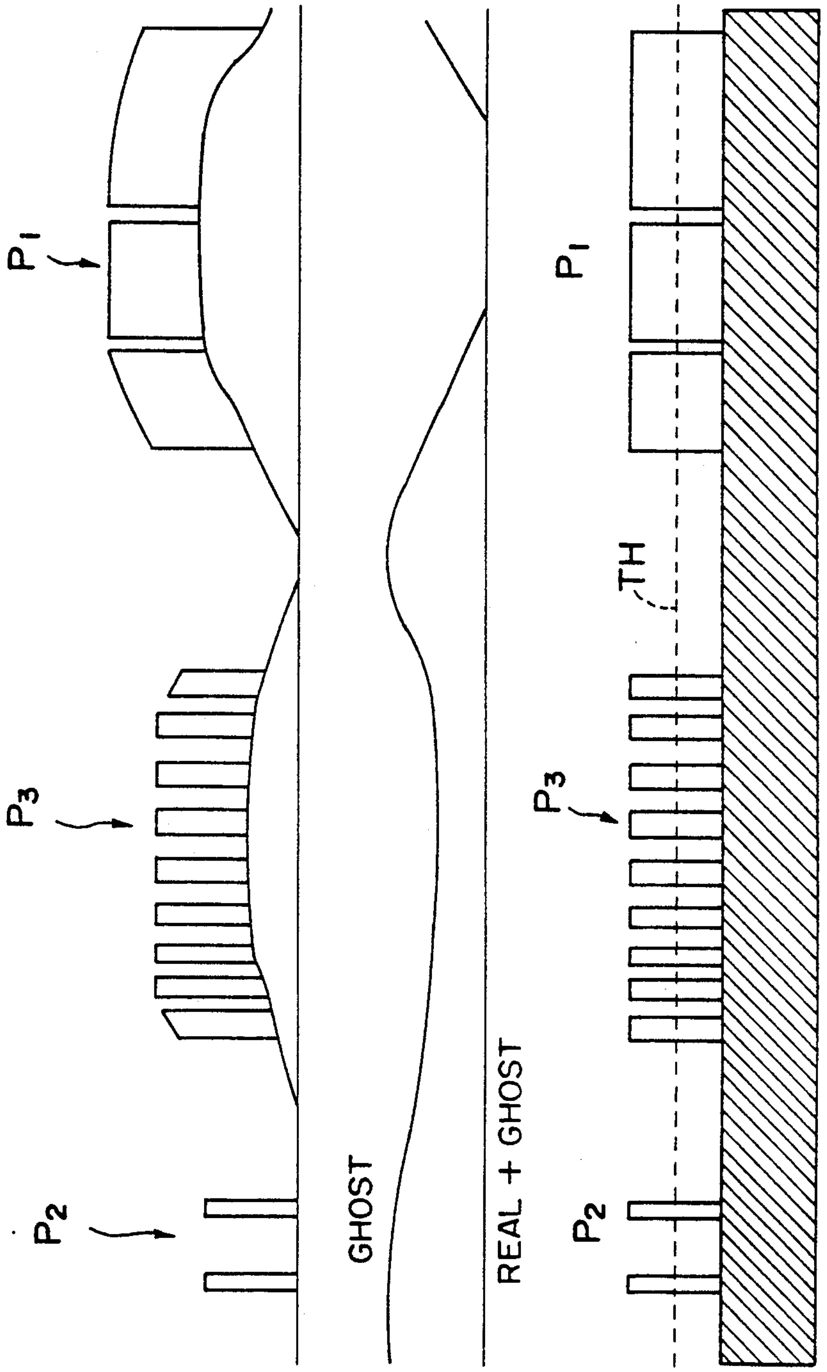
FIGS. 4(A)–4(C) are diagrams showing the ghost exposure process proposed conventionally for eliminating the proximity effect.
Figure 5:
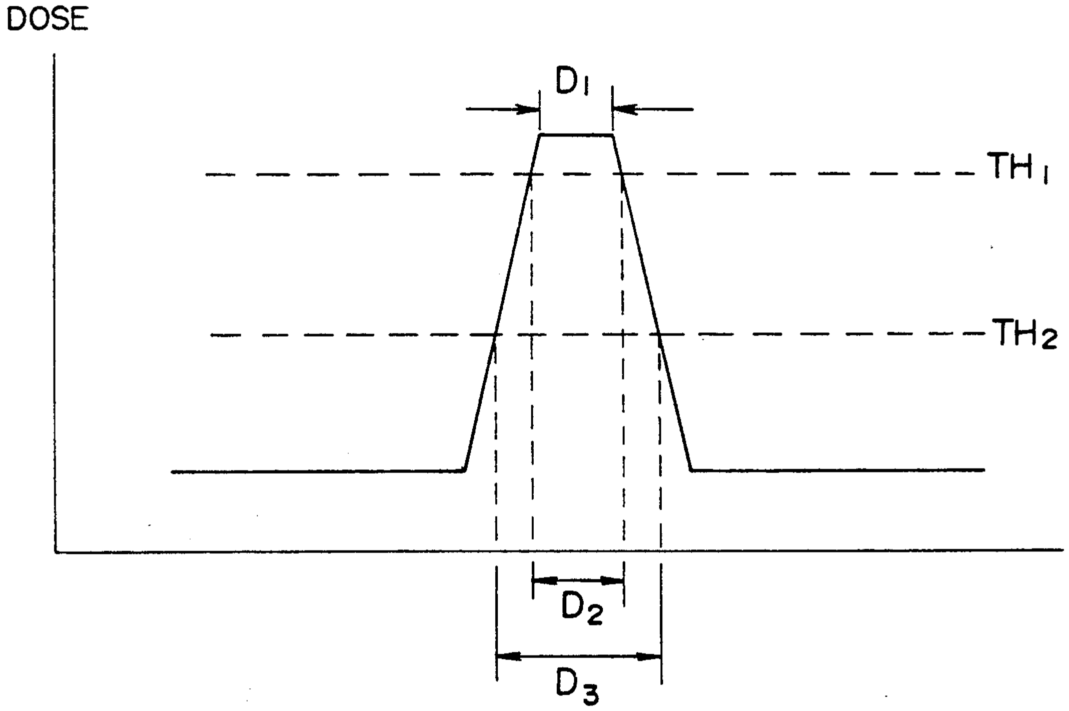
FIG. 5 is a diagram showing the change of size of the exposed pattern caused by the change of dose of the exposure.
Figure 6A:
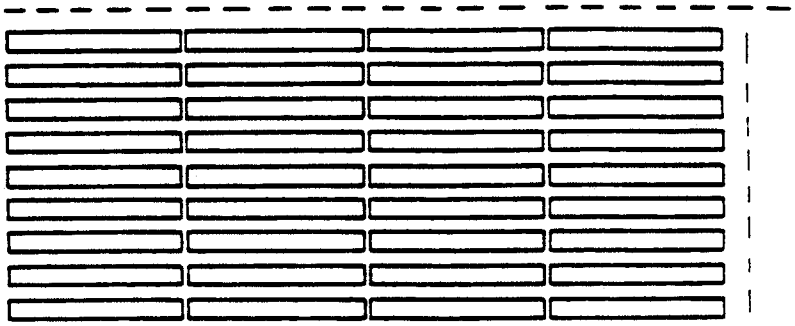
FIGS. 6(A)–6(D) are diagrams showing a conventional process for eliminating the proximity effect and the problem pertinent to such a conventional process.
Figure 6B:
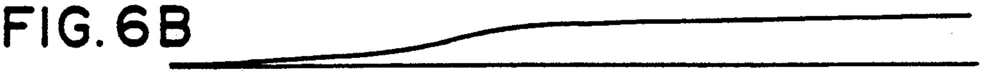
Figure 6C:
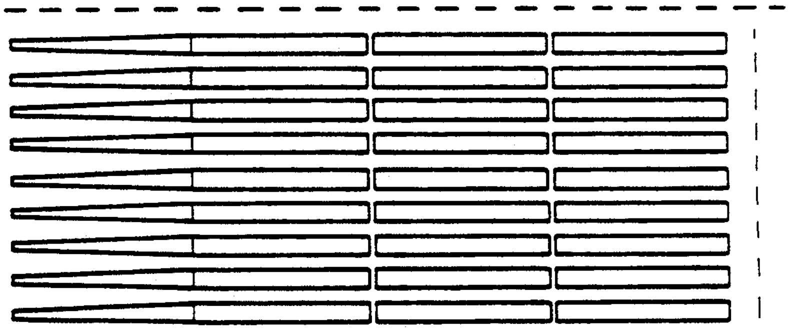
Figure 6D:
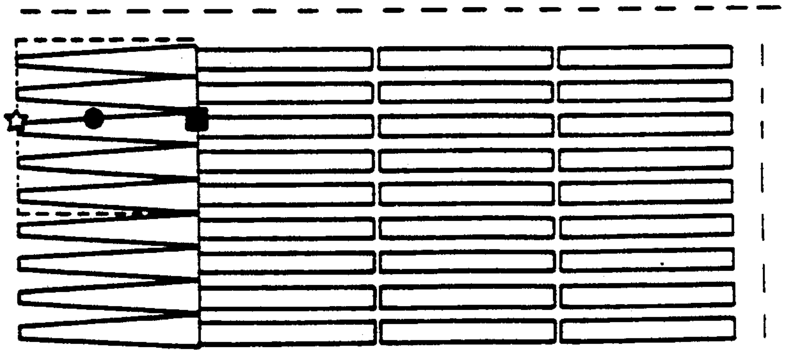
Figure 7B:
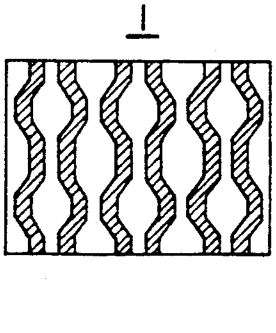
FIG. 7(B) is a diagram showing an example of the content of a pattern block that forms the device pattern of FIG. 7(A)

Referring to FIG. 7(A), the device pattern includes a number of pattern blocks 1 that corresponds to the blocks 1*a*, 1*b*, . . . formed on the block mask 110 of FIG. 2. For example, the pattern block 1 may include the pattern shown in FIG. 7(B). In the pattern of FIG. 7(A), the numerals attached to each pattern block 1 indicate the pattern density that represents the proportion of the exposed area in a given pattern block 1. In correspondence to the tendency of repetitive exposure of same device pattern in the memory devices, there appears an exposed region 1A as indicated by a broken line in FIG. 7(A) wherein the pattern blocks 1 have substantially the same pattern density throughout the region 1A. Typically, the pattern density of a block 1 assumes the value of about 40–50% in the ordinary memory devices. Further, it should be noted that the exposed region 1A is surrounded by unexposed region that contains unexposed pattern blocks.

Figure 8B:
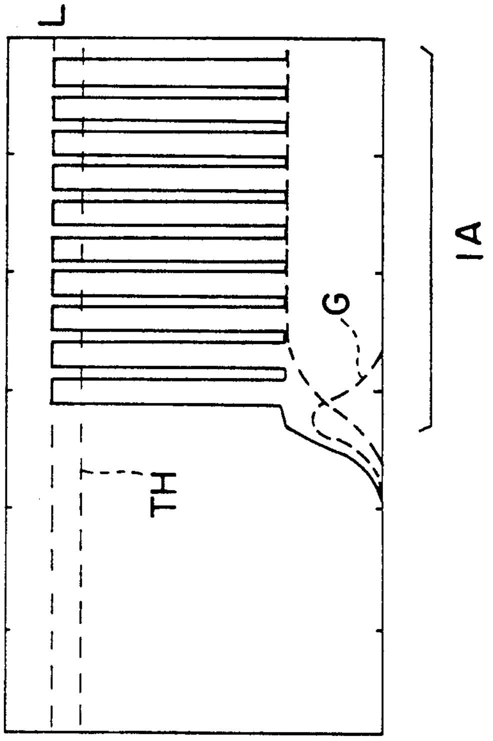
FIGS. 8(A) and 8(B) are diagrams showing the elimination of the proximity effect according to the first embodiment of the present invention.
Figure 8A:
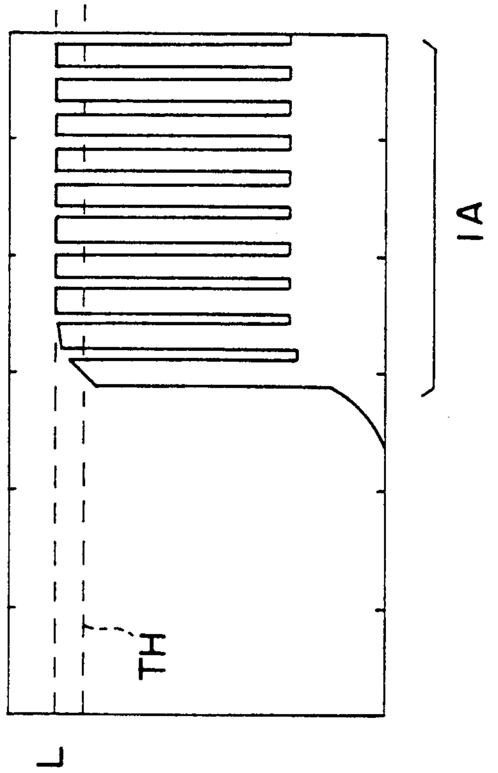

In such an exposed region 1A, the dose of exposure inevitably decreases at the marginal part because of the proximity effect as shown in FIG. 8(A) even when the dose is adjusted to a predetermined level L which is determined in relation to the threshold of exposure TH of the electron beam resist.

In the first embodiment of the present invention, such a proximity effect is corrected by applying a ghost exposure selectively to the marginal part of the exposure region 1A by a defocused electron beam as indicated in FIG. 8(B) by a broken line designated as G. Typically, the beam size of the defocused electron beam is set to about 3 μm in correspondence to the length of backscattering of electrons. Thereby, the dose of the ghost exposure is set such that the total exposure, defined as a sum of the dose by the electron beam and the dose by the ghost beam, becomes the same in the central part of the exposure region 1A and in the marginal part thereof. As a result of such a selective ghost exposure, the level of the background is made substantially flat as shown in FIG. 8(B) and the proximity effect is successfully canceled out. As the additional ghost exposure is applied only at the marginal part of the exposure region, there is no serious decrease of exposure efficiency, in contrast to the conventional ghost exposure process.

Figure 9:
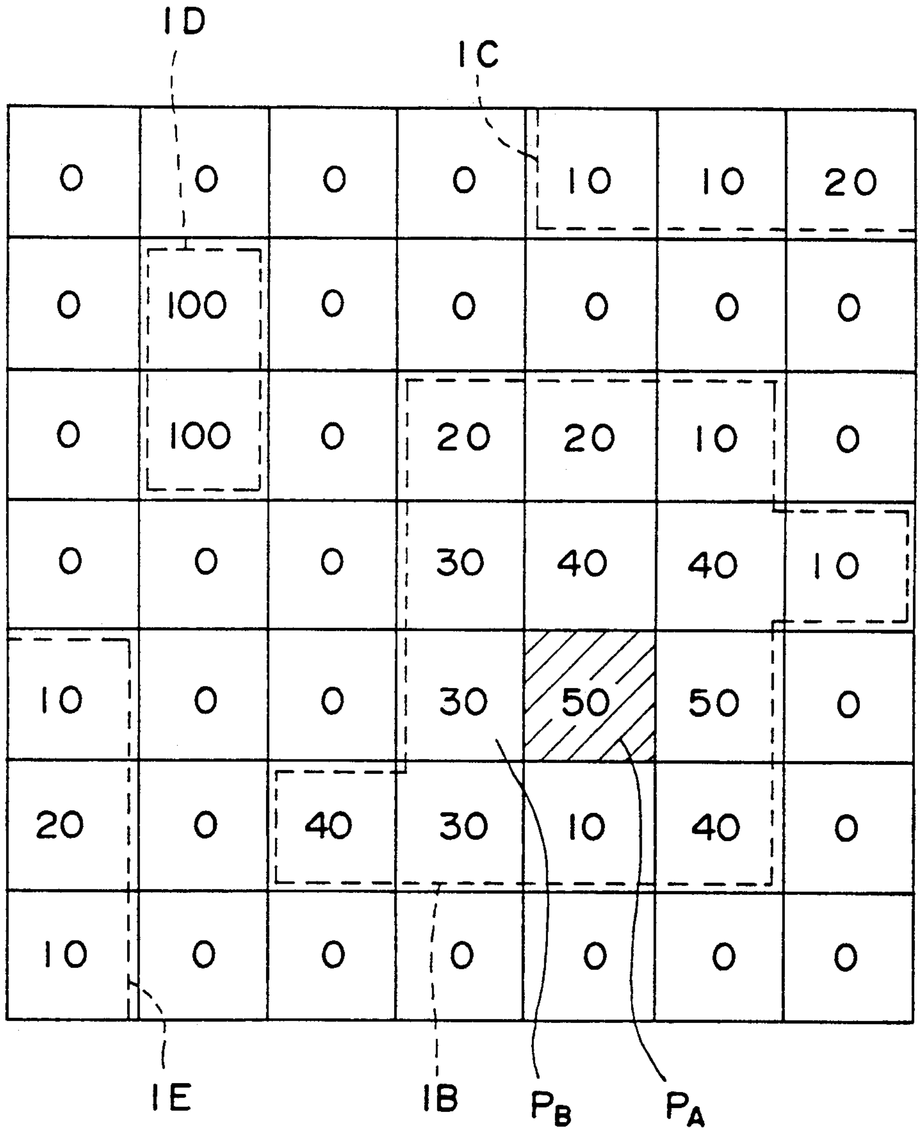
FIG. 9 is a diagram showing a device pattern that is subjected to a second embodiment process of the present invention.

The process of FIG. 8(B) is applicable to most of the semiconductor memories that includes device patterns with more or less a uniform pattern density. On the other hand, there can occur a case wherein the pattern density may be changed in each pattern block within one exposure region as shown in FIG. 9. Hereinafter, a second embodiment of the present invention applicable to such a case will be described.

Referring to FIG. 9 showing the device pattern to which the second embodiment of the present invention is applied, there are several mutually distinct exposure regions 1B, 1C, 1D, 1E, . . . that are separated from each other by an unexposed region. Further, the pattern density $\alpha$ may change in each pattern block as represented in the exposure region 1B. In the exposure region 1B, it should be noted that the pattern density changes from 10% to 50%. In such a case, there occurs a variation in the backscattering of electrons in each pattern block and one needs a compensation for the proximity effect that is caused as a result of variation of the backscattering of electrons.

Figure 10:
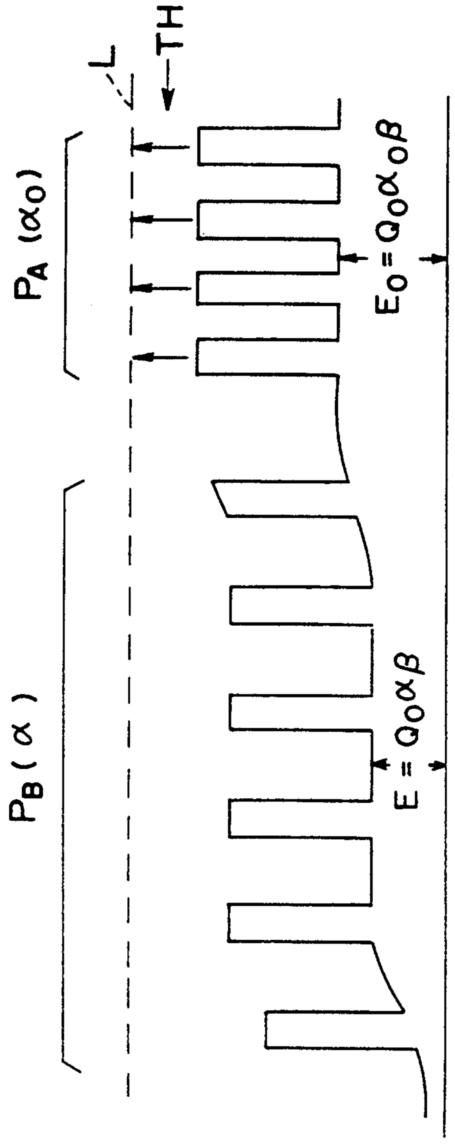
FIGS. 10(A) and 10(B) are diagrams showing the elimination of the proximity effect according to the second embodiment of the present invention.
Figure 10:
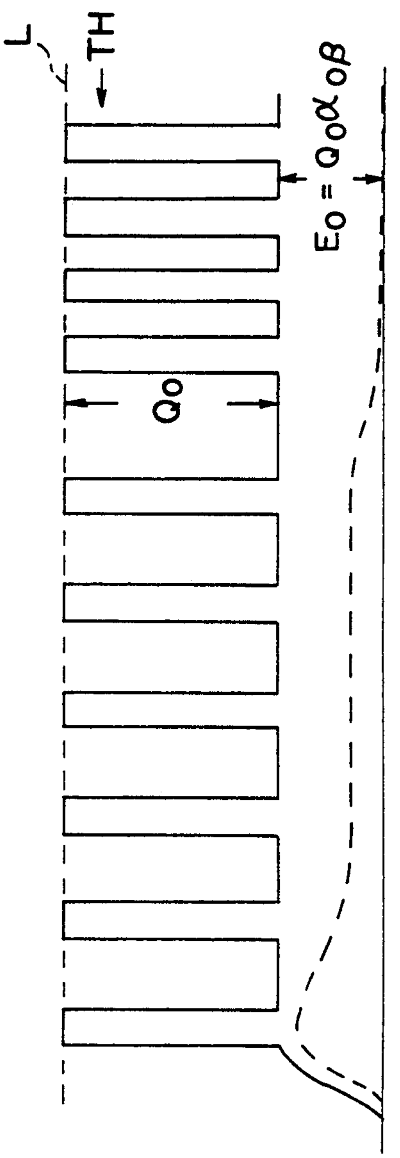

FIGS. 10(A) and 10(B) show the compensation of the proximity effect according to the second embodiment of the present invention.

Referring to FIG. 10(A) showing two pattern blocks $P_A$ and $P_B$ formed adjacent with each other in a selected exposure region such as the region 1B of FIG. 9, the first pattern block $P_A$ has a first reference pattern density $\alpha_0$ that may for example be set to 50%. Further, the second pattern block $P_B$ may have a second pattern density $\alpha$ set to 30%, for example. It should be noted that the first pattern density $\alpha_0$ is the maximum pattern density in the exposure region. In other words, the pattern block having the maximum pattern density is selected as the first pattern block $P_A$. The first pattern block thus selected is used as a reference pattern block as will be described below. Generally, such a reference pattern block $P_A$ includes the smallest pattern having the smallest pattern width in the selected exposure region.

Once the reference pattern block $P_A$ is selected, the dose $Q_0$ of exposure is adjusted at first such that the total dose, including the background exposure, reaches a predetermined level L. See FIG. 10(A). More specifically, the dose $Q_0$ is set to satisfy a relationship $$L = Q_0(1+\alpha_0\beta), \quad (1)$$

where $\beta$ represents the backscattering caused in the pattern blocks where the pattern density $\alpha$ is 100%. The parameter $\beta$ in turn is obtained by integrating the backscattering of electrons given as $b \cdot \exp[-r/C^2]$ according to the equation $$\begin{aligned} \beta &= \int 2\pi r \cdot b \cdot \exp[-(r/C)^2]dr \\ &= \pi C^2 b, \end{aligned} \quad (2)$$

where the parameter b represents the strength of the backscattering electrons while the term $\exp[-(r/C)^2]$ represents the profile or distribution of such backscattered electrons. Further, the parameter C represents the range that a backscattered electron can reach. Generally, the parameter C takes a value of about 3 $\mu$m. It should be noted that the diameter of the defocused electron beam used in the first embodiment for eliminating the proximity effect at the marginal part of the exposure region is set in correspondence to this parameter C. Thus, by using the parameters $\alpha$ and $\beta$, the dose $Q_0$ is determined from Eq.(1). Further, this dose $Q_0$ is used throughout for the exposure of other pattern blocks such as the pattern block $P_B$ that are included in the same exposure region 1B. Of course, the value of the dose $Q_0$ changes depending on the exposure region. Thus, the adjustment of the dose $Q_0$ is achieved independently in each exposure region of FIG. 9.

Referring to FIG. 10(B) again, it will be noted that the background exposure caused by the backscattered electrons is smaller in the second pattern block $P_B$ where the pattern density $\alpha$ is smaller than the first pattern density $\alpha_0$. Thus, there is a need for compensating for the decreased background level in order to achieve a proper exposure of the pattern block $P_B$. The present embodiment achieves this compensation by applying additional exposure by a defocused electron beam as shown in FIG. 10(B). In FIG. 10(B), the broken line at the bottom part of the drawing represents the additional exposure conducted by the defocused electron beam. There, the additional exposure is achieved by setting the dose Q as $$Q = Q_0(\alpha_0 - \alpha)\beta/(1+\beta) \quad (3)$$

in correspondence to the background exposure level shown in FIG. 10(A). Thereby, the change of the background exposure level is canceled out and a flat background as shown in FIG. 10(B) is obtained. Of course, the dose of individual pattern elements of the pattern block $P_B$ reaches the aforesaid level L by setting the dose according to Eq.(3). Generally, the dose level L is set such that the exposure threshold TH of the electron beam resist is located at about 75% of the level L. It should be noted that no additional exposure is made for the selected, reference pattern block $P_A$. Thereby, there is no degradation in the resolution of the exposed pattern.

It should be noted that the dose Q of Eq.(3) is obtained by setting the defocused electron beam to have a size $S_x$X $S_y$ which are determined according to the relationship $$S_xS_yQ = S_{0x}S_{0y}Q_0(\alpha_0 - \alpha)\beta/(1+\beta) \quad (4)$$

where $S_{0x}$ and $S_{0y}$ represent the size of the pattern block measured along two perpendicular edges.

Next, the compensation for the proximity effect is considered for the case where there is a pattern block of very large pattern density adjacent to and in connection with an exposure region that contains essential device patterns. It should be noted that FIG. 9 shows the exposure region 1D that includes the pattern block that has a very large pattern density. On the other hand, the exposure region 1D of FIG. 9 is isolated from other exposure regions and did not cause problem in the exposure of the exposure region 1B.

When a pattern block having a very large pattern density is formed adjacent to the exposure regions that include fine device patterns such as the exposure region 1B, there occurs a problem that the dose of exposure in the region 1B may be affected by the strong backscattering caused by the pattern block having the large pattern density. In such a case, the compensation of the proximity effect according to the second embodiment is no longer effective. Hereinafter, a third embodiment of the present invention for eliminating this problem will be described.

Figure 11A:
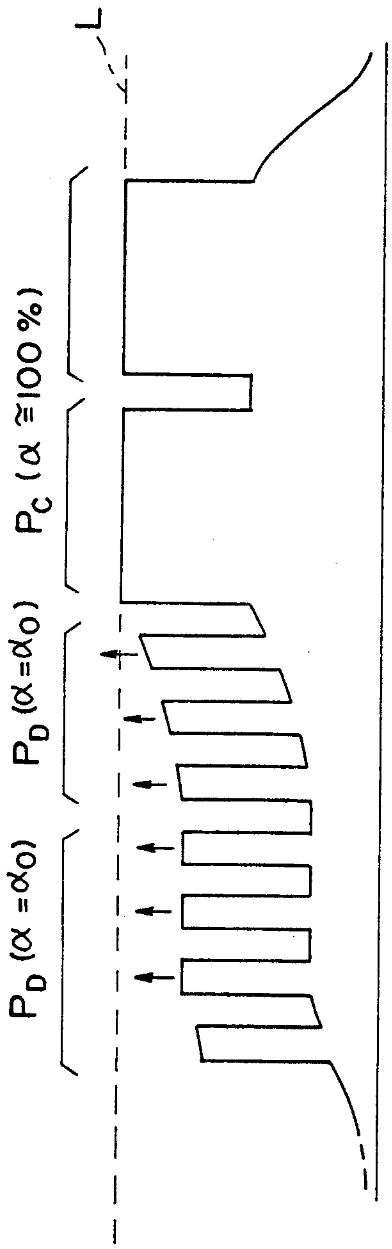
FIGS. 11(A)–11(C) are diagrams showing the elimination of the proximity effect according to a third embodiment of the present invention.

FIG. 11(A) shows the typical situation wherein a selected, reference pattern blocks $P_D$ and $P_D'$ both having a reference pattern density $\alpha_0$ is formed adjacent to a pattern block $P_C$ that has a pattern density $\alpha$ of about 100%. In such a case, it will be noted that the background exposure level is raised at the block $P_D'$ located immediately adjacent to the block $P_C$ because of the large backscattering from the pattern block $P_C$.

Figure 11B:
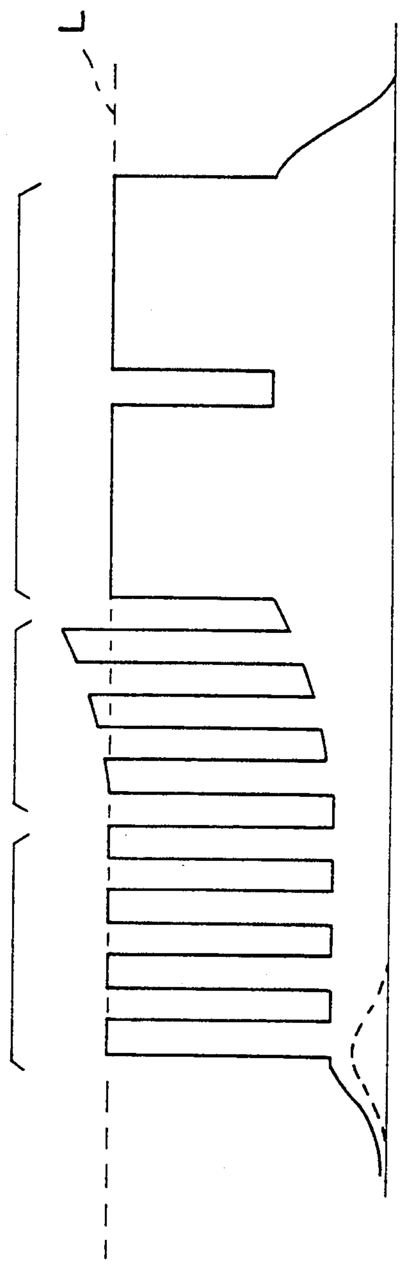

Thus, when the level of dose is set to $Q_0$ to reach the level L as shown in FIG. 11(B), the dose for the part $P_D'$ inevitably exceeds the level L because of the backscattering from the pattern block $P_C$. Thereby, the exposure of the pattern block $P_D'$ inevitably becomes excessive and the accuracy of the exposed pattern is degraded.

Figure 11C:
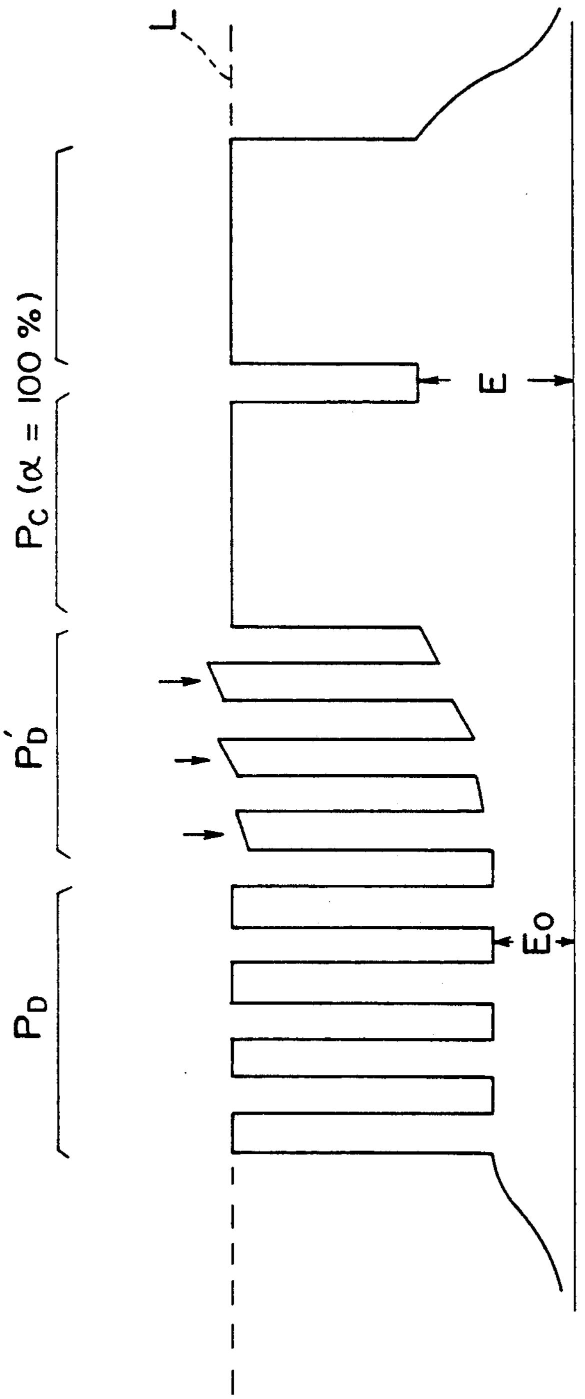

In the present embodiment, the foregoing problem is avoided by decreasing the dose $Q_0$ in correspondence to the part $P_D'$ with an amount corresponding to the backscattering from the pattern block $P_C$. See FIG. 11(C). Thereby, the dose of the pattern block $P_D$ is optimized including the block $P_D'$. Such a decrease of dose is achieved by reducing the exposure time of the pattern block $P_D$ according to the relationship $$\tau = T_0(1+E_0)/(1+E) \quad (5)$$

where $T_0$ represents the exposure time corresponding to the reference dose $Q_0$, while $E_0$ and E are given as $E_0 = Q_0\alpha_0\beta$ and $E = Q_0\alpha\beta$. As the size of the blocks $P_D$, $P_D'$, . . . is set to about 3 μm that is approximately equal to the length C characterizing the backscattering length of electrons, the increase of background exposure at the marginal part of a pattern block of large pattern density is successfully eliminated by selectively decreasing the level of dose.

Figure 12:
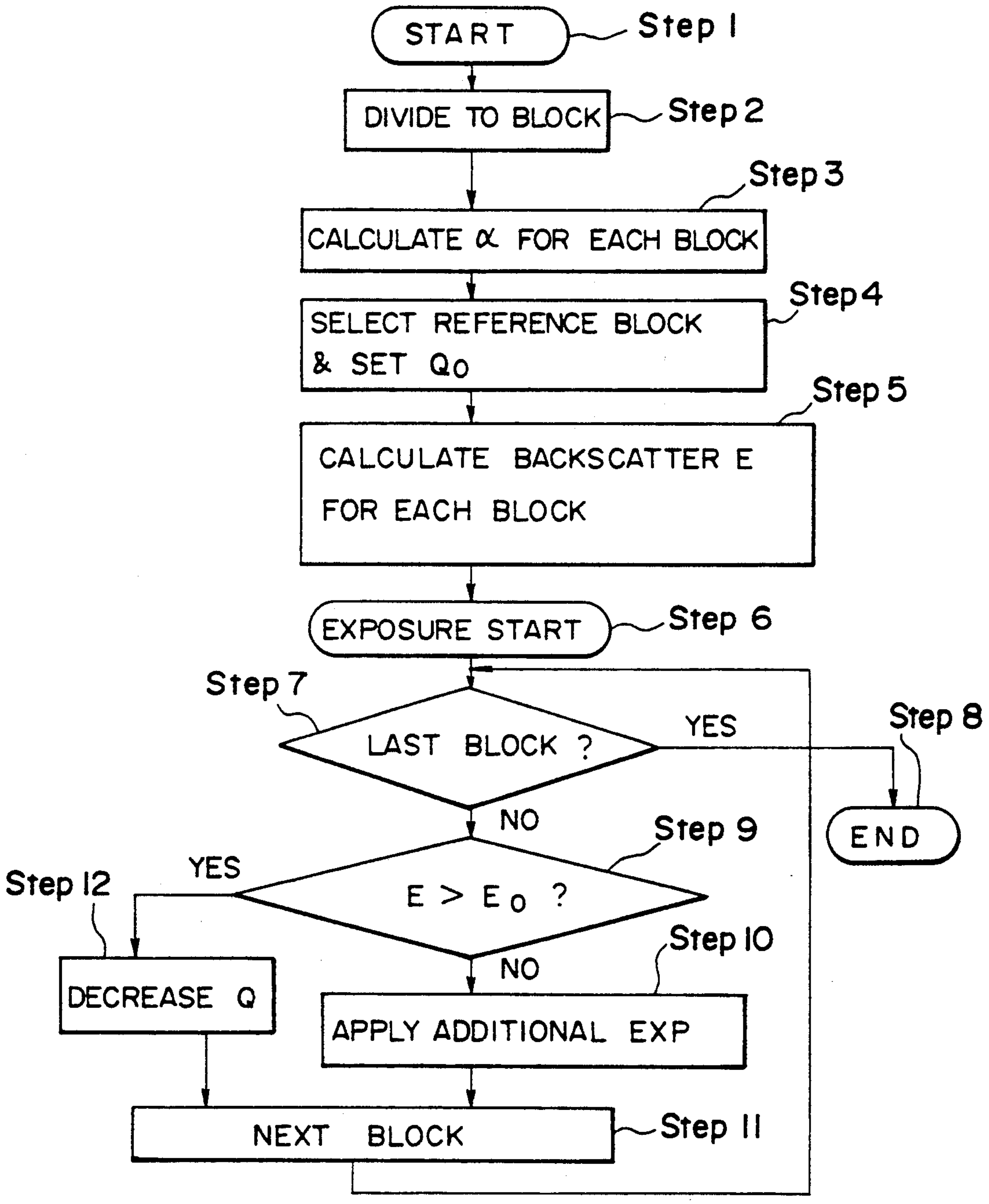
FIG. 12 is a flowchart summarizing the process of the present invention.

FIG. 12 summarizes the foregoing process for correcting the proximity effect according to the first through third embodiments.

Referring to FIG. 12, the process is started in a step 1 and the pattern to be exposed on the substrate is divided into a number of blocks in a step 2. In a step 3 following the step 2, the pattern density α is calculated for each pattern block, and a reference pattern block such as the pattern block $P_A$ is selected. Further, the adjustment of the dose $Q_0$ as shown in FIG. 10(B) is achieved in the step 4. Further, in a step 5, the backscattering E is calculated for each of the blocks.

Figure 1:
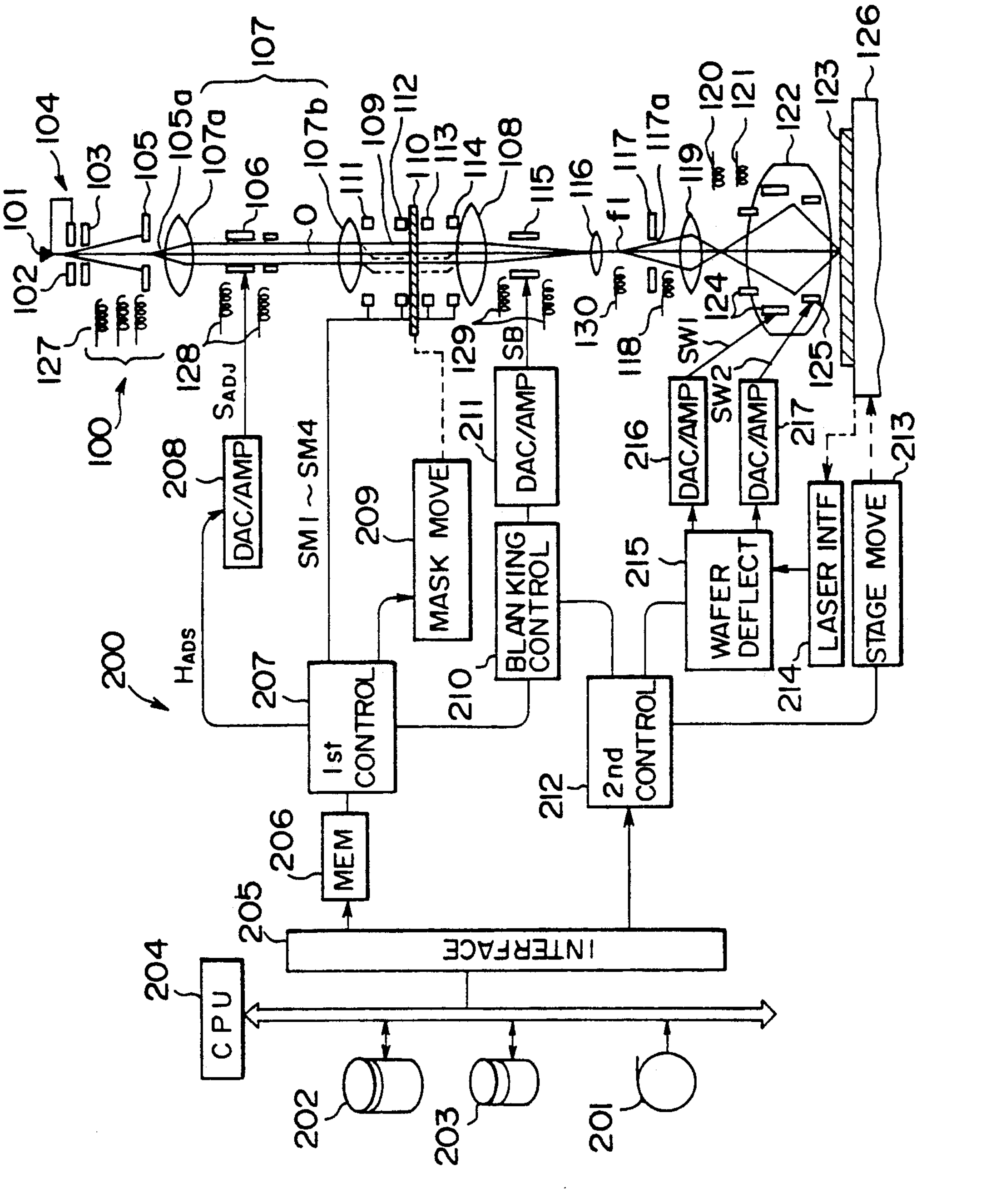
FIG. 1 is a diagram showing the construction of a conventional electron beam exposure system that is used in the present invention.

Next, in a step 6, the real exposure is started by activating the electron beam exposure system of FIG. 1. Thus, in a step 7, a discrimination is made whether the block under processing is the last block of the exposed pattern or not. If YES, the exposure process is terminated in a step 8. On the other hand, if the result of the step 7 is NO, a step 9 is conducted to discriminate whether the level of backscattering E of the block exceeds the reference backscattering level $E_0$ of the reference block.

When the result of discrimination in the step 9 is NO indicating the block pattern under processing having the pattern density α which is smaller than the reference pattern density $\alpha_0$, the additional exposure by the defocused electron beam is conducted in a step 10 as indicated in FIG. 10(B) by the broken line.

When the result of discrimination in the step 9 is YES, on the other hand, the dose Q is decreased in a step 12 according to the relationship of Eq.(5), and the process for the next block is started in a step 11.

According to the present invention, one can adjust the dose of exposure uniformly for all of the pattern blocks included in a pattern while maximizing the resolution for the pattern blocks. Thereby, the problem of the proximity effect is successfully and effectively eliminated.

Figures 13A, 13B:
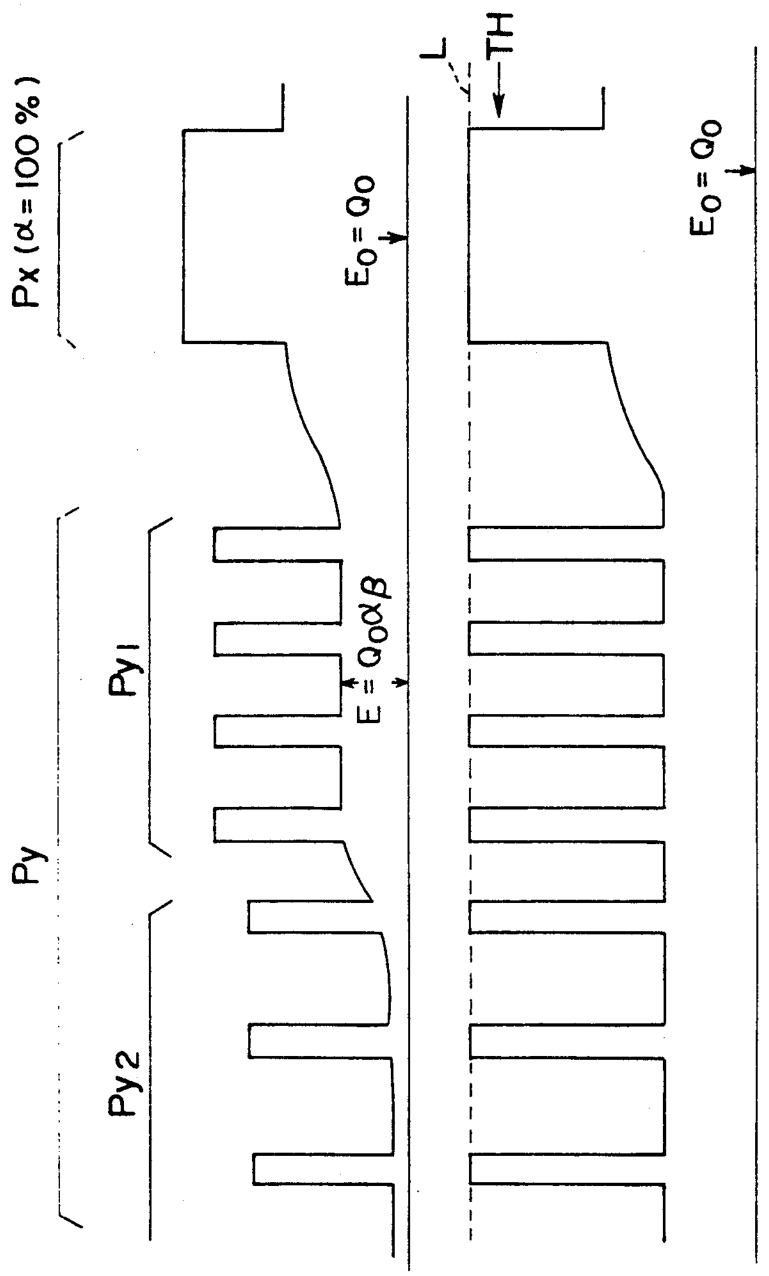
FIGS. 13(A) and 13(B) are diagrams showing the elimination of the proximity effect according to a fourth embodiment of the present invention.

Next, a fourth embodiment of the present invention will be described with reference to FIGS. 13(A) and 13(B) showing the setting of the dose level of the electron beam for the pattern such as the one shown in FIG. 9 wherein the exposure region having a very large pattern density such as the region $1_D$ coexists with the exposure region having a modest pattern density such as the region $1_B$.

In FIGS. 13(A) and 13(B), the exposure region designated as $P_x$ corresponds to the region $1_D$ of FIG. 9 having the pattern density of about 100%, while the exposure region designated as $P_y$ corresponds to the region $1_B$. Here, it is assumed that the correction of the dose according to the second embodiment of the present invention is already applied to the exposure region $P_y$ that includes pattern blocks $P_{y1}$ and $P_{y2}$.

Referring to FIG. 13(A) showing the case wherein the same dose level of electron beam is used for the region $P_x$ and the region $P_y$, there naturally occurs a variation of the total doze because of the difference in the backscattering of the electrons and hence the pattern density α. In order to obtain the same total doze for all the regions $P_x$ and $P_y$ as shown in FIG. 13(B), it is necessary to change the dose of the electron beam depending on the pattern density of the exposure region. Here, it should be noted that the total dose $E_0$ for the region $P_y$ is given as $$E_0 = Q_0(1+\beta),$$

while the total dose $E_1$ for the region $P_x$ having the pattern density α is given as $$E_1 = Q(1+\alpha\beta),$$

wherein $Q_0$ represents the dose of the electron beam for the exposure region $P_x$, while Q represents the dose of the electron beam for the exposure region $P_y$. The term $Q_0\beta$ thereby represents the exposure by the backscattered electrons occurring in the region $P_x$ where $\alpha = 100\%$.

From the condition that the total dose $E_0$ for the exposure region $P_x$ is equal to the total dose $E_1$ for the exposure region $P_y$, one obtains the following equation that determines the dose Q based upon the reference dose $Q_0$ as a function of the pattern density α as $$Q = (1+\beta)Q_0/(1+\alpha\beta).$$

Thus, by setting the dose of the electron beam for each of the exposure region according to the above equation, one can successfully compensate for the proximity effect in the exposure operation as shown in FIG. 13(B).

It should be noted that the present invention is not limited to the electron beam lithography process but is also applicable to other lithography process that uses a charged particle beam for the exposure.

Other objects and further features of the present invention will become apparent from the following detailed description when read in conjunction with the attached drawings.

What is claimed is:

1. A method for writing a pattern on an object by a finely focused charged particle beam, comprising the steps of:

dividing said pattern to be written on said object into a plurality of pattern blocks separated from each other with a distance that is small enough such that a proximity effect is caused with each other;

determining a pattern density that represents a proportion of an exposed area in the pattern blocks, for each of said pattern blocks;

selecting a specific pattern block as a reference pattern block and setting a dose level of the charged particle beam for said reference pattern block to a reference dose level determined such that said reference pattern block is exposed with a predetermined, first total dose level, said first total dose level being defined as a sum of said reference dose level and a backscattering dose level caused by a backscattering of charged particles from said object;

exposing said plurality of pattern blocks including said reference pattern block by the charged particle beam with said reference dose level; and exposing those pattern blocks that have the pattern density smaller than the pattern density of said reference pattern block by a defocused charged particle beam with a second total dose level, defined as a sum of said reference dose level, a backscattering dose level caused by a backscattering of charged particles from said object, and a dose level of said defocused charged particle beam, such that said second total dose level becomes substantially identical with said first total dose level.

2. A method as claimed in claim 1 in which said step of dividing the pattern is achieved such that each pattern block has a size corresponding to the backscattering length of charged particles.

3. A method as claimed in claim 1 in which said step of dividing the pattern comprises the step of identifying a pattern block that does not include a pattern to be exposed, and said step of exposing the pattern blocks by the defocused charged particle beam is achieved while excluding those pattern blocks that do not include the pattern to be exposed.

4. A method as claimed in claim 1 in which said step of exposing by the defocused charged particle beam is achieved with a dose determined substantially according to the relationship $$Q = Q_0(\alpha_0 - \alpha)\beta/(1+\beta)$$

where $Q_0$ represents said reference dose, $\alpha_0$ represents the pattern density for said reference pattern block, and $\beta$ represents the backscattering caused in a pattern block wherein the pattern density $\alpha$ is 100%.

5. A method as claimed in claim 4 in which said step of exposing by the defocused charged particle beam is achieved by setting a size $S_x$ and $S_y$ of the defocused charged particle beam according to a relationship $$S_x S_y Q = S_{0x} S_{0y} Q_0(\alpha_0 - \alpha)\beta/(1+\beta)$$

where $S_{0x}$ and $S_{0y}$ represent the size of the pattern block measured in two, mutually opposing directions on said object.

6. A method as claimed in claim 1 in which said method further comprises the steps of: identifying a pattern block having a backscattering dose level that exceeds the backscattering dose level of said reference pattern block; and exposing said pattern block thus identified by the charged particle beam with a dose level that is decreased with respect to the reference dose, such that the pattern block thus identified is exposed with a total dose substantially identical with said first total dose level of said reference pattern block.

7. A method as claimed in claim 6 in which said pattern block having the backscattering dose level that exceeds the backscattering dose level of the reference pattern block has a pattern density that exceeds the reference pattern density.

8. A method as claimed in claim 7 in which an exposure time of the charged particle beam is achieved according to a relationship $$\tau = T_0(1+E_0)/(1+E)$$

where $T_0$ represents the exposure time for achieving the reference dose level $Q_0$, $E_0$ represents the intensity of the backscattered charged particles in the reference pattern block, and E represents the intensity of the backscattered charged particles in the pattern block having the pattern density exceeding the reference pattern density.

9. A method for writing a pattern on an object by a focused charged particle beam, comprising the steps of:

exposing a predetermined exposure pattern defined with respect to a non-exposure region by a boundary, by means of a charged particle beam with a substantially uniform dose, such that said exposure pattern is exposed at a central part thereof with a first total dose level, said first total dose level being defined as a sum of said uniform dose and a dose caused by backscattered charged particles; and irradiating a defocused electron beam selectively along said boundary of said predetermined exposure pattern such that a second total dose level, defined as a sum of a dose caused by said defocused beam, a dose caused by backscattered charged particles, and said uniform dose, becomes substantially identical with said first total dose level.

10. A method as claimed in claim 9 in which said predetermined exposure pattern is separated from other exposure patterns with a distance such that no proximity effect appears.

11. A method for writing a pattern on an object by a focused charged particle beam, comprising the steps of:

dividing the pattern to be exposed into a plurality of pattern blocks separated from each other with a sufficient distance such that no proximity effect occurs between adjacent pattern blocks;

determining a pattern density that represents a proportion of an exposed area in the pattern for each of said pattern blocks;

selecting a specific pattern block that has the largest pattern density as a reference pattern block;

setting a dose level of the charged particle beam with respect to said reference pattern block to a reference dose level such that said reference pattern block is exposed with a predetermined total dose level that is defined as a sum of said dose level of said charged particle beam and a backscattering dose level caused by a backscattering of charged particles from said object;

setting a dose level of a defocused charged particle beam with respect to each of said pattern blocks excluding said reference pattern block such that each of said pattern blocks is exposed with a dose level that is determined as a function of the pattern density such that a sum of said dose level of said defocused charged particle beam, said reference dose level and a backscattering dose level caused by a backscattering of charged particles from said object becomes substantially identical with said predetermined total dose level; and exposing said plurality of pattern blocks including said reference pattern block by the charged particle beam with respective dose levels determined with respect to said plurality of pattern blocks.

12. A method as claimed in claim 11 in which said step of setting the dose level of the defocused charged particle beam with respect to the each of said pattern blocks comprises the step of determining the dose of the charged particle beam according to a relationship $$Q=(1+\beta)Q_0/(1+\alpha\beta)$$

where Q represents the dose used for exposing each of said pattern blocks except for said reference pattern block, $Q_0\beta$ represents the dose caused in said reference pattern block by said backscattering of charged particles, and $\alpha$ represents the pattern density of said pattern blocks.

* * * * *

UNITED STATES PATENT AND TRADEMARK OFFICE

CERTIFICATE OF CORRECTION

PATENT NO. : 5,278,419

DATED : January 11, 1994

INVENTOR(S) : Yasushi TAKAHASHI et al.

It is certified that error appears in the above-indentified patent and that said Letters Patent is hereby corrected as shown below:

Title page, Other Publication, change "Jun." to --June--.

Abstract, line 16, change "the" to --a--.

Column 1, line 37, after "process" insert --.--.

Column 12, lines 19 and 21, change "doze" to --dose--.

Column 13, line 19, change "the" to --a--

Column 14, line 49, after "pattern" insert --blocks,--.

Signed and Sealed this

Ninth Day of August, 1994

*Attest:*

BRUCE LEHMAN

*Attesting Officer*

*Commissioner of Patents and Trademarks*